United States Patent
Ferraro et al.

(10) Patent No.: US 11,422,169 B2
(45) Date of Patent: Aug. 23, 2022

(54) DUAL-VOLTAGE CAPACITIVE SENSOR

(71) Applicant: Schneider Electric Industries SAS, Rueil-Malmaison (FR)

(72) Inventors: Venanzio Ferraro, Grenoble (FR); Massimo Secci, Savona (IT); Sébastien Chabanet, La Tronche (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 17/313,166

(22) Filed: May 6, 2021

(65) Prior Publication Data
US 2021/0356499 A1 Nov. 18, 2021

(30) Foreign Application Priority Data

May 13, 2020 (EP) .................................... 20174511

(51) Int. Cl.
*G01R 27/26* (2006.01)
*G01R 19/175* (2006.01)
(Continued)

(52) U.S. Cl.
CPC .......... *G01R 19/175* (2013.01); *G01R 15/06* (2013.01); *G01R 15/16* (2013.01); *H01G 4/38* (2013.01)

(58) Field of Classification Search
CPC ........ G01R 15/04; G01R 15/06; G01R 15/14; G01R 15/16; G01R 15/18; G01R 15/165;
(Continued)

(56) References Cited

U.S. PATENT DOCUMENTS

2017/0038414 A1* 2/2017 Barba Jimenez .. G01R 19/0084
2017/0227582 A1 8/2017 Iida et al.
(Continued)

FOREIGN PATENT DOCUMENTS

EP 2857848 A1 4/2015
WO 2018114661 A1 6/2018

OTHER PUBLICATIONS

Extended European Search Report dated Oct. 12, 2021 for European Patent Application No. 21170372.3-1010, 8 pages.
(Continued)

*Primary Examiner* — Thang X Le
(74) *Attorney, Agent, or Firm* — Locke Lord LLP (57) ABSTRACT

A capacitive voltage sensor apparatus including an electrically insulating body, an elongated conductor embedded at least partially in the insulating body, a first floating sensor electrode embedded in the insulating body and capacitively coupled to the elongated conductor and configured to provide a first output representing the voltage of the elongated conductor, and a second floating sensor electrode embedded in the insulating body and capacitively coupled to the elongated conductor and configured both to provide a second output representing the voltage of the elongated conductor and to shield the first floating sensor electrode from electric fields that may originate from sources external to the capacitive voltage sensor apparatus. A capacitor may be embedded in the insulating body and electrically connected with the first electrical sensor to form a capacitive voltage divider that provides the first output. The first output may provide a precision LPVT output and the second output may provide an output for a voltage presence indication system or voltage detection indication system.

14 Claims, 9 Drawing Sheets

(51) Int. Cl.
*G01R 15/06* (2006.01)
*G01R 15/16* (2006.01)
*H01G 4/38* (2006.01)

(58) Field of Classification Search
CPC .............. G01R 21/002; G01R 21/003; G01R 19/0084; G01R 19/175; G01R 31/327
See application file for complete search history.

(56) References Cited

U.S. PATENT DOCUMENTS

2019/0237260 A1 8/2019 Stollwerck et al.
2020/0191832 A1* 6/2020 Djogo .................. G01R 15/144
2020/0333385 A1* 10/2020 Wang .................... G01R 21/06

OTHER PUBLICATIONS

Extended European Search Report dated Nov. 17, 2020 for European Patent Application No. 20174511.4-1010, 7 pages.

* cited by examiner

DUAL-VOLTAGE CAPACITIVE SENSOR

BACKGROUND

The present disclosure relates to voltage sensing in electrical distribution systems, and more particularly to capacitive voltage sensors, some embodiments of which are particularly well-suited for metering and/or protection as well as voltage presence indication in high-voltage (HV) and/or medium-voltage (MV) environments, such as in MV switchgear, controlgear, and power transformer.

Capacitive voltage sensors have been implemented in various components of electrical power transmission and distribution systems. For instance, in medium-voltage electrical power distribution systems, capacitive voltage sensors have been implemented as stand-alone capacitive voltage transformers (sometimes referred to as capacitive Low Power Voltage Transformers (LPVTs)) for voltage measurement for metering and/or protection (e.g., for protective relays). Capacitive sensors (e.g., configured as capacitive voltage dividers) have also been incorporated into some components such as bushings, insulators, and T-connectors, such as those used in MV switchgear, controlgear, and power transformer.

Designing capacitive sensors capable of providing desired and/or required reliable, accurate voltage measurement (e.g., magnitude and phase) over variations in monitored voltage (e.g., providing linearity) and sensor temperature (e.g., due to external environment and/or monitored-conductor current-induced temperature variations), as well as under stray high electric fields (e.g., due to neighboring phases) and possibly under additional electromagnetic noise sources, remains technically challenging. Some known approaches attempting to address such challenges include, for example, sensor designs employing electrically grounded shields (e.g., a Faraday cage) and/or external compensation (e.g., based on the sensor temperature-based and/or the apparent measured voltage).

Smart Grid development and deployment further increases the need for precise (e.g., such as IEC Accuracy Class 1 or, in some applications, possibly 0.5 or 0.2) capacitive voltage sensors for use throughout, e.g., the electrical power distribution network, such as in secondary substations. To facilitate Smart Grid deployment, such capacitive sensors should be compact (e.g., to fit within available space in existing switchgear, controlgear, or power transformer), and preferably capable of being implemented as standard-sized components (e.g., a bushing) that may readily replace existing components that do not incorporate a sensor. The multitude of smart sensors required by the Smart Grid also presents a particular need for accurate capacitive sensors that may be manufactured cost-effectively.

Accordingly, there remains a need for improved capacitive voltage sensors that are well-suited for providing accurate voltage measurements (e.g., possibly for protection or metering, such as smart metering sensors as may be required for implementing Smart Grid functionalities), preferably well-suited for use in existing distribution equipment such as switchgear, controlgear, power transformer and/or preferably well-suited for manufacturing cost-effectively.

SUMMARY OF SOME ILLUSTRATIVE EMBODIMENTS

The present disclosure describes various illustrative embodiments of a capacitive voltage sensor apparatus, including some embodiments comprising an electrically insulating body, an elongated conductor embedded at least partially in the insulating body, a first floating sensor electrode embedded in the insulating body and capacitively coupled to the elongated conductor and configured to provide a first output representing the voltage of the elongated conductor, and a second floating sensor electrode embedded in the insulating body and capacitively coupled to the elongated conductor and configured both to provide a second output representing the voltage of the elongated conductor and to shield the first floating sensor electrode from electric fields that may originate from sources external to the capacitive voltage sensor apparatus. A capacitor may be embedded in the insulating body and electrically connected with the first electrical sensor to form a capacitive voltage divider that provides the first output. In some embodiments, the first output provides a precision LPVT output and the second output provides a VPIS or VDIS output. Some such embodiments are not only well-suited for providing precise voltage measurement, but also for providing compact and cost-effective sensors, at least insofar as a separate grounded shield electrode embedded within the capacitive voltage sensor apparatus may be excluded therefrom.

In accordance with some embodiments, a capacitive voltage sensor apparatus comprises an electrically insulating body (e.g., comprising an epoxy resin) having an outer surface; an electrical conductor at least partially embedded in the insulating body; a first terminal configured to electrically connect the electrical conductor to an external conductor to be sensed; a first electrically conductive sensor electrode disposed in the electrically insulating body between the electrical conductor and the outer surface of the electrically insulating body, wherein the first electrically conductive sensor electrode is electrically floated and capacitively coupled to the elongated electrical conductor; a second electrically conductive sensor electrode disposed in the electrically insulating body between the first electrically conductive sensor electrode and the outer surface of the electrically insulating body, wherein the second electrically conductive sensor electrode is electrically floated and capacitively coupled separately to the electrical conductor and the first electrically conductive sensor electrode; a first output terminal on the electrically insulating body and electrically coupled to the first electrically conductive sensor electrode to provide a first output signal representing the voltage of the electrical conductor; a second output terminal on the electrically insulating body and electrically coupled to the second electrically conductive sensor electrode to provide a second output signal representing the voltage of the electrical conductor; and a third terminal on the electrically insulating body configured to be electrically connected to a reference potential.

In some embodiments, the capacitive voltage sensor may preferably further comprise a capacitor disposed within said electrically insulating body and configured to electrically couple said first electrically conductive sensor electrode to said third terminal, thereby forming a capacitive voltage divider. The capacitor may be disposed on or in a printed circuit board that is mounted on the second electrically conductive sensor.

The second output terminal and the third terminal may be configured as an inner conductor and an outer shield conductor, respectively, of an electrical connector that is coupled to said printed circuit board.

In some embodiments, the electrical conductor is elongated and extends lengthwise within the insulating body, wherein said first terminal is integral to a first longitudinal end of the electrical conductor that is exposed through the insulating body.

In some embodiments, the second electrically conductive electrode may be configured as a cylindrical shell disposed coaxially with the elongated electrical conductor and extending longitudinally over a second length, thereby defining an interior volume between the electrical conductor and the second electrically conductive electrode, wherein the first sensor electrode is disposed completely within the interior volume and has a longitudinal extent that is less than the second length. In addition, the first electrically conductive electrode may be configured as a cylindrical shell disposed coaxially with and radially surrounded by the first electrically conductive electrode. A respective cylindrical segment of each longitudinal end of the second electrically conductive electrode may be separated from the electrical conductor by a respective portion of the insulating body that does not include a portion of the first electrically conductive electrode, wherein the respective cylindrical segments are separated by an intervening segment of the second electrically conductive electrode having the second length and radially surrounding the first electrically conductive electrode.

In some embodiments, the capacitive voltage sensor apparatus is configured as a bushing, wherein the first terminal is integral to a first longitudinal end of the electrical conductor that is exposed through the insulating body, and wherein a second longitudinal end of the electrical conductor opposite to the first longitudinal end is exposed through the insulating body and includes a second terminal configured to electrically connect the electrical conductor to a second external conductor to provide for current conduction between the first and second external conductor via the electrical conductor.

In some embodiments, the first terminal is configured to be coupled to a bulbar, and the capacitive voltage sensor is configured as a low-power voltage transformer, a post insulator, or a bus support.

In some embodiments, the second sensor electrode has a capacitance configured for coupling to a voltage presence indicating system (e.g., VPIS or VDIS).

Some embodiments may further comprise a temperature sensor embedded in the electrically insulating body, and a second connector disposed on the electrically insulating body and electrically connected to the temperature sensor. The temperature sensor may be mounted on a second printed circuit board.

It will be appreciated by those skilled in the art that the foregoing brief description and the following description with respect to the drawings are illustrative and explanatory of some embodiments of the present invention, and are neither representative nor inclusive of all subject matter and embodiments within the scope of the present invention, nor intended to be restrictive or characterizing of the present invention or limiting of the advantages which can be achieved by embodiments of the present invention, nor intended to require that the present invention necessarily provide one or more of the advantages described herein with respect to some embodiments. Thus, the accompanying drawings, referred to herein and constituting a part hereof, illustrate some embodiments of the invention, and, together with the detailed description, serve to explain principles of some embodiments of the invention.

BRIEF DESCRIPTION OF THE DRAWINGS

Aspects, features, and advantages of some embodiments of the invention, both as to structure and operation, will be understood and will become more readily apparent in view of the following description of non-limiting and non-exclusive embodiments in conjunction with the accompanying drawings, in which like reference numerals designate the same or similar parts throughout the various figures, and wherein.

DETAILED DESCRIPTION OF SOME ILLUSTRATIVE EMBODIMENTS

Throughout the description and claims, the following terms take at least the meanings explicitly associated herein, unless the context dictates otherwise. The meanings identified below do not necessarily limit the terms, but merely provide illustrative examples for the terms.

The phrase "an embodiment" as used herein does not necessarily refer to the same embodiment, though it may. In addition, the meaning of "a," "an," and "the" include plural references; thus, for example, "an embodiment" is not limited to a single embodiment but refers to one or more embodiments. Similarly, the phrase "one embodiment" does not necessarily refer the same embodiment and is not limited to a single embodiment. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise.

In addition, as used herein, unless the context clearly dictates otherwise, the term "coupled" refers to directly connected or to indirectly connected through one or more intermediate components and, in some contexts, may also denote or include electrically coupled, such as conductively coupled, capacitively coupled, and/or inductively coupled. Further, "conductively coupled (connected)," "electrically coupled (connected)," and "galvanically coupled (connected)," and similar variants, each refer to being coupled (connected) via one or more intermediate components that permit energy transfer via conduction current, which is capable of including direct current as well as alternating current, while "capacitively coupled" refers to being electrostatically coupled through one or more dielectric media, and possibly also via one or more intervening conductors (e.g., via a series of capacitive components), that permit energy transfer via displacement current and not via direct current between the coupled (connected) components. Those skilled in the art will further understand that elements may be capacitively coupled intentionally or unintentionally (e.g., parasitically) and that in some contexts, elements said to be capacitively coupled may refer to intentional capacitive coupling. In addition, those skilled in the art will also understand that in some contexts the term "coupled" may refer to operative coupling, through direct and/or indirect connection. For instance, a conductor (e.g., an electrode or a wire, etc.) said to be coupled to a relay may refer to the conductor being operable to selectively cause operation of the relay (e.g., switching/triggering), regardless of whether the conductor is connected to the relay indirectly (e.g., via intermediary passive and/or active circuitry, etc.) and/or directly.

In addition, it will be understood that terminology such as "top," "upper," "bottom," "lower," "side," and the like, as used herein is a convention simply for convenience and ease of reference with respect to referring to the various views presented in the drawings, and does not otherwise impart any limitation on the overall design and/or orientation of dual-voltage capacitive sensor in accordance with the present disclosure.

Further, for ease of reference, as used herein, the term "sensor electrode" refers to an electrically conductive electrode, having sufficient electrical conductivity to function as a capacitor electrode in the context of the present disclosure. Similarly, for ease of reference, as used herein, the term "conductive" or "conductor" refers to electrically conductive or an electrical conductor (rather than, for example, thermal conductivity), unless the context clearly dictates otherwise. In this regard, it will be further understood that the term "conductor," as used herein, refers to the electrical conductivity of a material or component (e.g., in contrast to an insulator or dielectric) and not to whether the material or component is actively conducting current or even configured to conduct current, though some conductors may be configured for conducting current. Thus, for example, a bushing's central conductive rod, which is configured to be connected—and conduct electrical current—between a cable supplied by medium or high voltage source and another electrical component may be referred to as a conductor, regardless of whether the central conductive rod is conducting current or otherwise connected to the cable and electrical component. Likewise, however, by way of example, a central conductive rod may also be referred to as a conductor in other components (e.g., an LPVT or insulator) wherein the central conductive rod is not configured to conduct electrical current therethrough but is configured to function solely as an electrode (e.g., configured for electrical connection to a bulbar supplied by a medium or high voltage source without conducting current supplied by the medium or high voltage source).

For clarity, while the terms medium-voltage and high-voltage may have different definitions in various standards, or otherwise may be understood as having different meanings in various contexts, as used herein, medium-voltage may refer to an alternating current (AC) root-mean-square (rms) voltage in the range of about 1 KV to about 52 KV or to a direct current (DC) voltage in the range of about 1.5 KV to about 75 KV; and high-voltage may refer to an alternating current (AC) rms voltage greater than about 52 KV or to a direct current (DC) voltage greater than about 75 KV. As may be understood by the ensuing disclosure, however, embodiments in accordance with the present disclosure are not limited to a particular voltage or voltage range.

As will be further understood in view of the ensuing description, some embodiments provide a capacitive voltage sensor apparatus comprising (i) an elongated conductor configured to be electrically connected to an external conductor (e.g., a medium-voltage conductor, such as a bus bar or incoming feeder of a MV switchgear, controlgear, or power transformer), (ii) a first floating sensor electrode configured to provide a capacitive-voltage-divider LPVT output signal (e.g., for metering and/or protection) representing the voltage of the elongated conductor (i.e., representing the external conductor voltage when the elongated conductor is connected to the external conductor), and (ii) a second floating sensor electrode configured to provide a voltage presence indication output signal (e.g., for a voltage presence indicator system (VPIS), such as in accordance with the IEC 61243-5 and/or IEC 62271-206 and/or IEC 62271-713 standard) representing whether voltage is present on the elongated conductor (e.g., whether voltage is present on the external conductor when the sensor apparatus is connected to the external conductor), wherein the first floating sensor electrode is disposed between the elongated conductor and a portion of the second floating sensor electrode. The first and second floating sensor electrodes, and at least a portion of the elongated conductor are embedded in an insulating body that includes connector terminals at its exterior surface to which the first and second floating sensor electrodes are respectively electrically connected to provide the respective LPVT output signal and voltage presence indication output signal. In some embodiments, the second floating sensor is configured as a cylindrical shell that surrounds at least a portion of the elongated conductor and the interposed first floating sensor electrode, which in some embodiments may also be configured as a cylindrical shell.

Figure 1A:
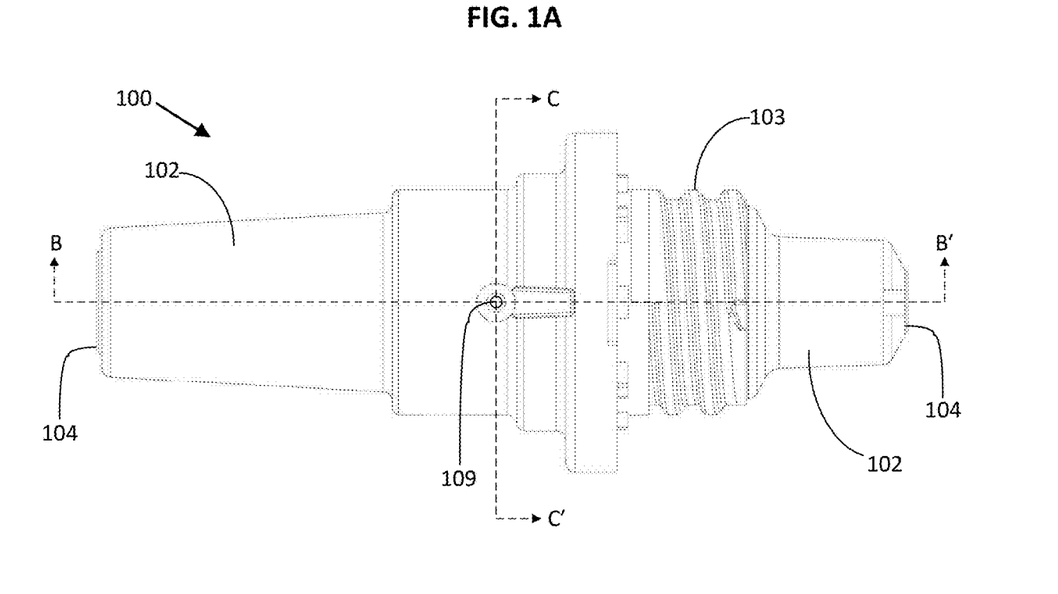
FIG. 1A schematically depicts a top view of a dual voltage capacitive sensor configured as a bushing, in accordance with some embodiments.
Figure 1B:
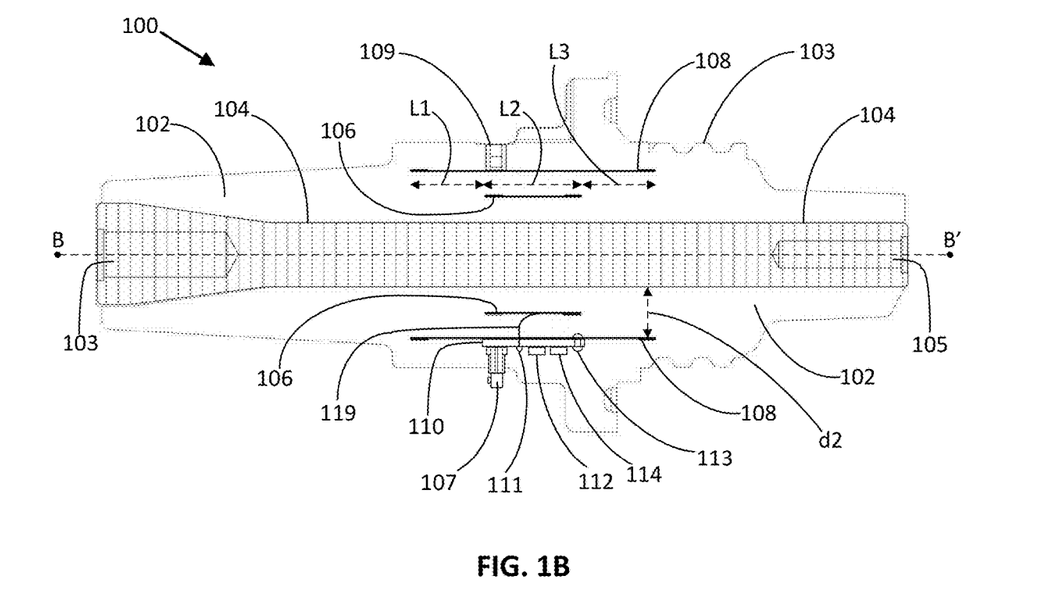
FIG. 1B schematically depicts a cross-sectional view of the bushing illustrated in FIG. 1A, viewed in the direction indicated by reference B-B' in FIG. 1A, in accordance with some embodiments.
Figure 1C:
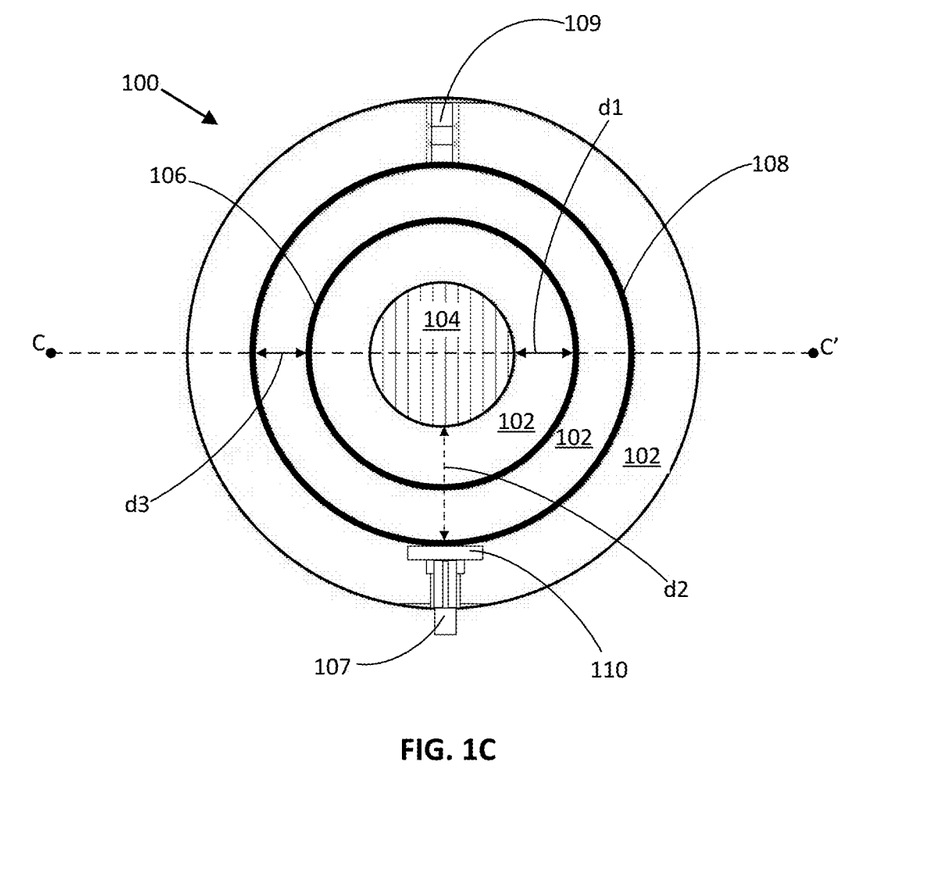
FIG. 1C schematically depicts a cross-sectional view of the bushing illustrated in FIG. 1A, viewed in the direction indicated by reference C-C' in FIG. 1A, in accordance with some embodiments.

FIGS. 1A-C schematically depict a top view and cross-sectional views of an illustrative bushing 100 comprising a plurality of capacitive voltage sensors in accordance with some embodiments according to the present disclosure. Although this illustrative embodiment is directed to a bushing, in view of the present disclosure, those skilled in the art will understand that embodiments of a dual-voltage capacitive sensor in accordance with the present disclosure are not limited to bushings, and include but are not limited to alternative and additional implementations such as separable connectors (e.g., T-body connectors, elbow connectors), back plugs of T-body connectors, post insulators, and stand-alone low-power voltage transformers (LPVTs; e.g., such as may be conductively coupled to a switchgear bus bar).

More specifically, FIG. 1A is a top view of bushing 100, FIG. 1B is a cross-sectional view of illustrative bushing 100 in the direction identified by reference arrows B-B' (FIG.

1A) into a plane that contains axis 101 and is perpendicular to reference arrows B-B', and FIG. 1C is a cross-sectional view of bushing 100 in the direction identified by reference arrows C-C' (FIG. 1A) into a plane that contains axis 101 and is perpendicular to reference arrows C-C'.

As shown in FIGS. 1A-C, in some embodiments illustrative bushing 100 may have a generally cylindrical shape about axis 101 and comprise the following: an insulating body 102 having an external threaded portion 103 for mounting the bushing; a conductor 104 that extends between opposite longitudinal ends of the bushing and includes openings 103 and 105 for connection to external conductors; a cylindrical-shell-shaped sensor electrode 106 spaced away from and generally coaxial with conductor 104; a cylindrical-shell-shaped sensor electrode 108 spaced away from and surrounding and generally coaxial with sensor electrode 106; a printed circuit board (PCB) 110 mounted on sensor electrode 108 via fastener 113; a solder joint 111 formed on PCB 110 to electrically connect thereto one end of a conductor 119 (e.g., an insulated wire) that passes through an aperture or opening in sensor electrode 108 and an aperture or opening through PCB 110, and has an opposite end electrically connected (e.g., soldered) to sensor electrode 106; parallel-connected or series-connected capacitors 112 and 114 (e.g., film chip capacitors) mounted on PCB 110 and having a first common terminal thereof conductively coupled to solder joint 111 (and thus to sensor 106); a connector 107 mounted on PCB 110 and having a portion exposed to the exterior of insulating body 102, and having an inner conductor conductively coupled to solder joint 111 (and thus to sensor electrode 106 and to the first terminal of connected capacitors 112 and 114), and having an outer shield conductor conductively coupled to a second terminal of connected capacitors 112 and 114; and a connector 109 electrically connected to sensor electrode 108 and having a portion exposed to the exterior of insulating body 102. The outer shield conductor of the connector 107 corresponds to a third terminal.

As such, as further described below following further description of the various components of bushing 100, sensor electrode 106 and conductor 104 effectively form a capacitor that is connected in series with the parallel-connected or series-connected capacitors 112 and 114, such that the signal provided across the inner and outer conductors of connector 107 is a voltage-divided representation of the voltage of conductor 104. In addition, sensor electrode 108 and conductor 104 effectively form a capacitor, and sensor electrode 108 is configured both (i) to provide an output signal at connector 109 representing a separate measurement of the voltage of conductor 104 (corresponding to its capacitive coupling to conductor 104), and (ii) to shield electrode 106 from external electric fields. Such external electric fields may, for example, include near-field and/or quasi-static or low frequency fields (such as may be generated by nearby phases), as well as higher frequency electromagnetic fields. Such shielding by floating sensor electrode 108 facilitates accurate sensing by electrode sensor 106 of the electric field generated by conductor 104, thus facilitating accurate measurement of the conductor 104 voltage (e.g., such as may be required for metering and/or protection; such as IEC Accuracy Class 0.5).

As indicated, floating sensor electrode 108 not only shields electrode 106 from external fields, but also provides an additional and independent output signal (at connector 107) representing the voltage on conductor 104. This independent output signal may be used, for example, for voltage presence indication (e.g., for safety, such as in accordance with the IEC 62271-206 standard). Thus, in various implementations, a capacitive voltage sensor according to some embodiments (e.g., bushing 100) of the present disclosure may provide both VPIS and precision LPVT output signals, without necessarily requiring embedding a dedicated electric field shield (e.g., a grounded screen surrounding the LPVT sensor) within the bushing.

Referring again to FIGS. 1A-1C, it may be understood that in some embodiments such as the presently described illustrative bushing 100, insulating body 102 may substantially encapsulate sensor electrodes 106 and 108 (e.g., surrounding the electrodes—including the annular region between sensors 106 and 108 (having a length depicted by arrow L2)—except for the portion of sensor electrode 108 on which connector 109 is mounted). In addition, insulating body 102 may substantially encapsulate conductor 104 (e.g., surrounding conductor 104, except for the end portions of conductor 104 that are accessible at the exterior ends of bushing 100 for connection to external conductors), thereby encapsulating at least the portion of conductor 104 facing sensors 106 and 108. Insulating body 102 may be composed of one or more dielectric materials, such as an epoxy resin (e.g., ARALDITE®) (including, for example, cycloaliphatic epoxy resin), a polyurethane resin, a PTFE resin (e.g. TEFLON®), a ceramic, or other suitable insulating materials. In some embodiments, bushing 100 may be formed by performing a molding process (e.g., gravity casting process or automatic gelation process (APG)) to encapsulate or substantially encapsulate the components shown in FIGS. 1A and 1B in insulating body 102.

In some embodiments, insulating body 102 may comprise a common dielectric permittivity throughout, while in some embodiments, insulating body 102 may comprise a plurality of regions having respective dielectric permittivities (e.g., different regions may comprise different compositions of the same or similar material, and/or the different regions may comprise different materials). By way of non-limiting example, in some embodiments, insulating body 102 may be formed to provide the annular region between sensors 106 and 108 (having a length depicted by arrow L2 and thickness depicted by arrow d3) with a dielectric permittivity different from (e.g., lower than) the dielectric permittivity throughout the remainder of insulating body 102. Alternatively or additionally, in some embodiments, insulating body 102 may be formed to provide at least a portion of the annular regions between sensor electrode 108 and conductor 104 (having a lengths depicted by arrows L1 and L3) with a dielectric permittivity different from the dielectric permittivity throughout the bulk of insulating body 102, and either different from or substantially the same as the dielectric permittivity of the annular region between sensors 106 and 108.

In addition, it will be understood by those skilled in the art that in various alternative embodiments, additional components may be embedded in insulating body 102. By way of non-limiting example, in some embodiments, insulating body 102 may also encapsulate a thermal sensor as well as substantially encapsulate an additional output connector (e.g., similar to connector 107 or 109) to provide an output from the thermal sensor.

Figure 2A:
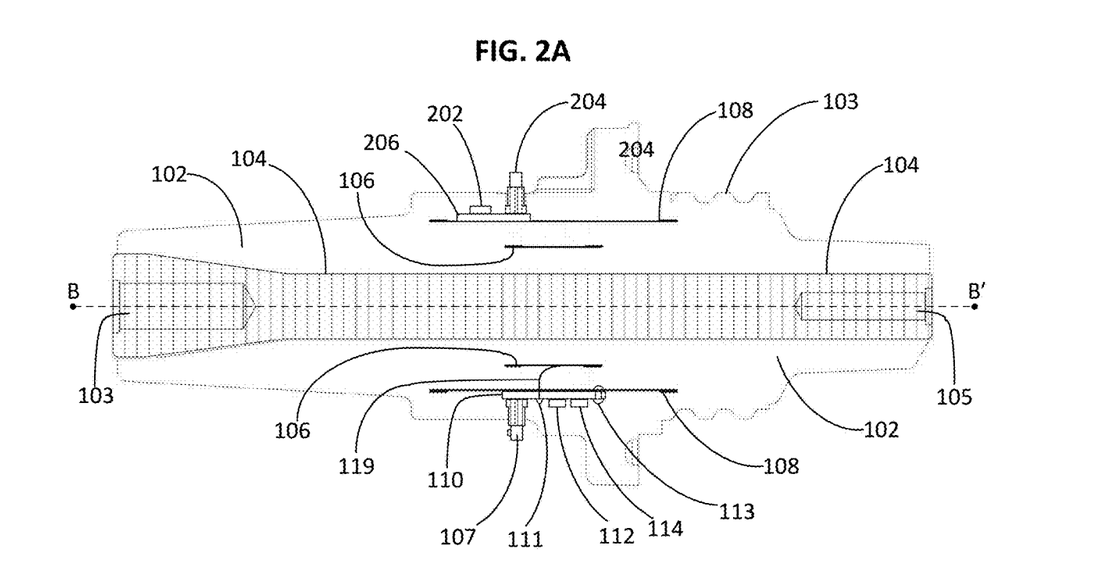
FIGS. 2A and 2B depict illustrative cross-sectional views corresponding to the views of FIGS. 1B and 1C, respectively, but for an illustrative alternative implementation, in accordance with some embodiments.
Figure 2B:
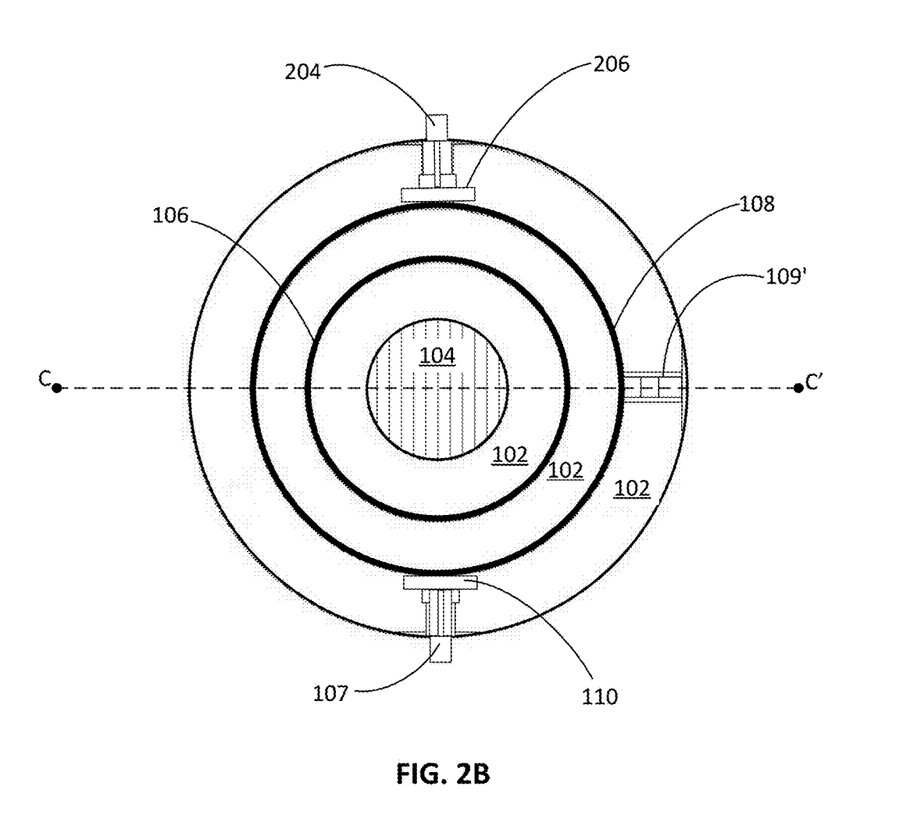

For instance, FIGS. 2A and 2B depict cross-sectional views corresponding to the views of FIGS. 1B and 1C, respectively, but for an illustrative alternative embodiment comprising a thermistor 202 mounted on a printed circuit board 204, which may be mounted on sensor electrode 108 (e.g., similar to PCB 110). A connector 206 electrically connected to thermistor 202 may be mounted on PCB 204 and extend externally to insulating body 102 to provide for connecting the thermistor to excitation and voltage readout circuitry. As shown, in this illustrative embodiment connector 109' corresponds to connector 109 of FIGS. 1A-C, but azimuthally displaced by 90 degrees. Alternatively, the connectors 107, 109, and 204 may be approximately equally spaced around the bushing circumference (e.g., separated azimuthally by 120 degrees) at the same longitudinal position and/or one or more of the connectors may be displaced longitudinally at varying azimuths. In addition to temperature monitoring, in some embodiments the temperature measurement signal may be used (e.g., if necessary) to compensate (e.g., based on pre-calibration) for temperature-dependent variations in the capacitive voltage divider transfer function. In accordance with some embodiments (such as the illustrative embodiment of FIGS. 1A-C), however, such compensation may not be required, even for precision voltage measurement, due to capacitors 112 and 114 preferably being embedded within insulating body 102 and having a temperature coefficient sufficiently comparable to that of sensor electrode 106.

Although preferably embedded within insulating body 102, in some alternative embodiments capacitors 112 and 114 (or, e.g., their equivalent individual discrete capacitance) may be implemented external to insulating body 102, such as in voltage measurement circuitry or, alternatively, in an external module that may be removably connected directly to connector 107 and that includes an additional connector for coupling to voltage measurement circuitry. Additionally, although (as indicated above) capacitors 112 and 114 may be implemented as surface-mount film chip capacitors mounted on a PCB, alternative implementations may, for example, employ one or more PCB-embedded capacitors, or a capacitor embedded in insulating body 102 but not mounted on a printed circuit board.

As described, in some embodiments conductor 104 may include openings 103 and 105 for connection to external conductors, such as to an incoming feeder cable and to electrical equipment in the apparatus in which bushing 100 is disposed (e.g., switchgear, controlgear, or power transformer). As such, openings 103 and 105 (and, e.g., the surrounding end portions of insulating housing 102) may be configured according to various interface connections. For instance, in some embodiments, opening 103 and/or opening 105 may be threaded for connection by way of a bolt or a threaded pin. Although, as shown, conductor 104 may typically be implemented with a circular cross-section and generally uniform diameter over a substantial central portion of its the length, some embodiments in accordance with the present disclosure may comprise alternative shapes (e.g., elliptical rather than circular in cross-section along the length, multiple longitudinal portions having different cross-sectional areas, etc.).

In some embodiments, such as the illustrative embodiment of FIGS. 1A and 1B, sensor electrodes 106 and 108 may be configured as substantially coaxial cylindrical conductors (e.g., which may be referred to as hollow cylindrical electrodes or cylindrical-shell electrodes). The longitudinal ends of sensor electrodes 106 and 108 may be rounded, such as by folding over the ends thereof. The dimensions identified by arrows L1, L2, L3, d1, and d2 in FIGS. 1B and 1C may be designed based on, for example, desired or required capacitive coupling of electrodes 106 and 108 to each other and to conductor 104 to provide outputs at connectors 107 and 109 with the desired electrical characteristics (e.g., voltage division, precision, and/or capacitance; as will be further understood in view of the ensuing disclosure), reliability (e.g., such as in view of leakage current, dielectric breakdown, etc.), and sufficient shielding by electrode 108 of electrode 106 from external electric fields.

Either or both of sensor electrodes 106 and 108 (whether configured as cylindrical shells or other geometric shapes) may be formed with an open mesh or screen structure, which may not only allow for ready insertion of conductor 119 through electrode 108, but may also improve bushing reliability as well as fabrication yield. For instance, during the molding process, such an open mesh or screen structure may readily permit free-flow of the material (e.g., epoxy resin) used to form insulating body 102 through the sensor electrodes, thereby facilitating conformal coverage. In some embodiments, a mesh or screen structure may be formed by coating a plastic mesh with a conductor, or by molding a conductive plastic that includes a conductive filler, such as nickel-coated graphite filler in nylon. In some embodiments, for example, one or more of electrodes 106 and 108 may be formed as a continuous conductive sheet structure (e.g., formed from sheet metal), possibly patterned and machined or etched to include one or more apertures and/or slots formed therein. Electrodes 106 and 108 may be formed from any of various sufficiently conductive materials, such as aluminum, brass, copper, or other metals or metal alloys.

Figure 3:
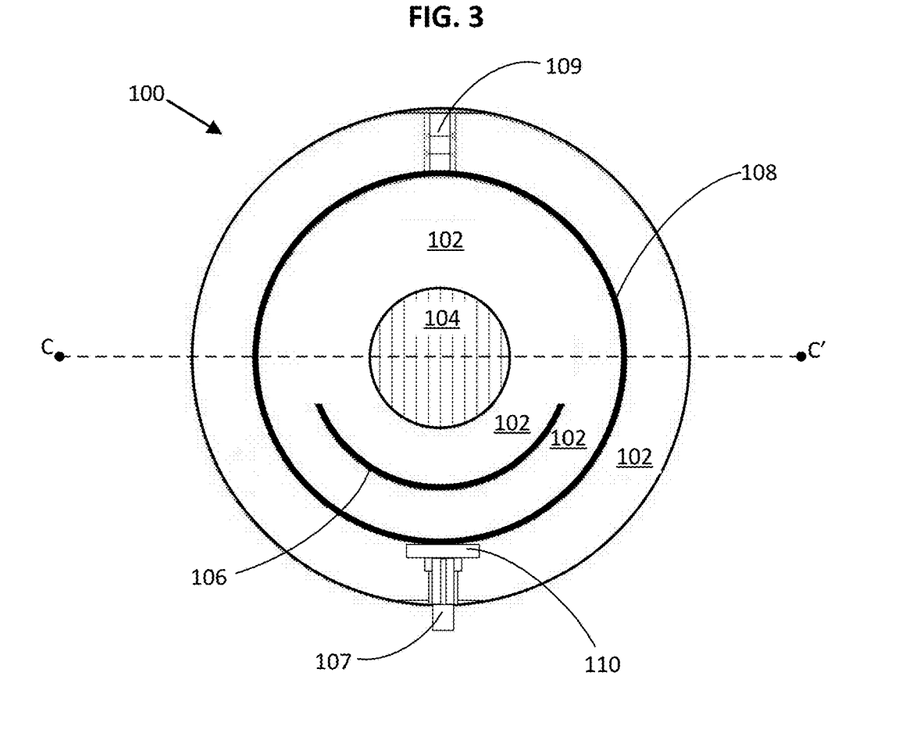
FIG. 3 illustrates a cross-sectional view similar to that of FIG. 1C, but for an illustrative alternative implementation, in accordance with some embodiments.

Although sensor electrodes 106 and 108 are depicted in the illustrative embodiment of FIGS. 1A-C as having a uniform radius, in some embodiments the radius of either or both of electrodes 106 and 108 may vary longitudinally (e.g., monotonically tapered over at least some extent). In some embodiments, electrodes 106 and 108 may have a uniform radius over length L2, while the radius of electrode 108 may be varied in regions L1 and L3. In some embodiments, electrode 106 and possibly also electrode 108 may not form a complete cylinder around conductor 104. For instance, FIG. 3 illustrates a cross-sectional view similar to that of FIG. 1C, but with electrode 106 partially surrounding conductor 104.

Figure 4:
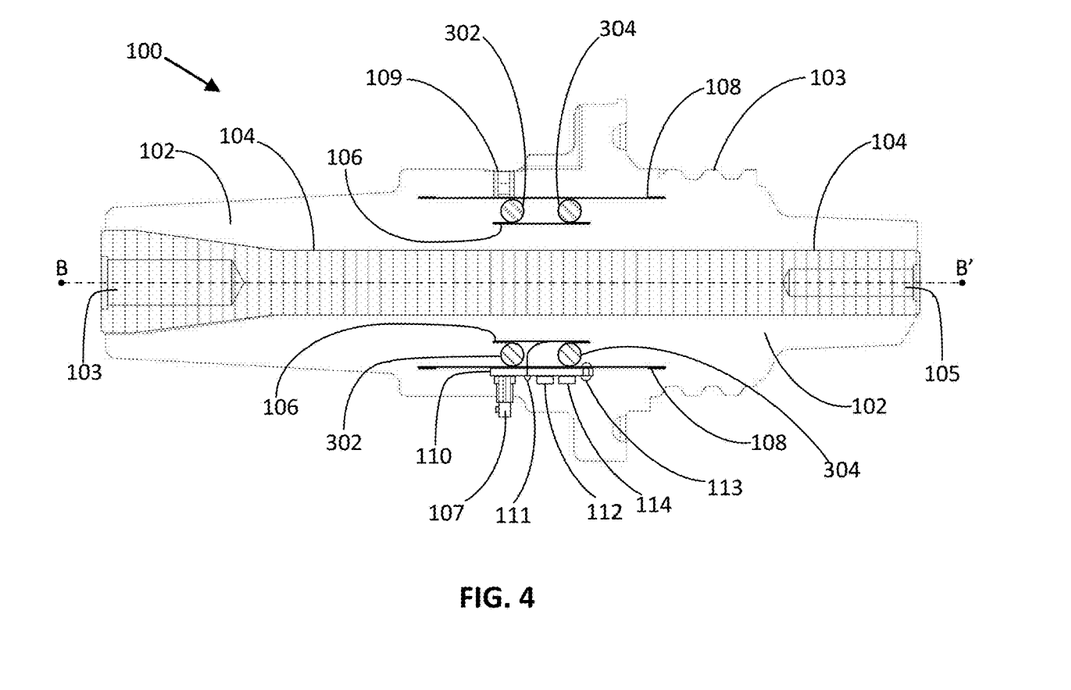
FIG. 4 depicts an illustrative cross-sectional view corresponding to the view of FIG. 1B, but for an illustrative alternative implementation, in accordance with some embodiments.

In some embodiments, sensors 106 and 108 may be formed into an integrated module prior to the molding or casting process used to form insulating body 102. For instance, as represented in the cross-sectional view of FIG. 4, which otherwise corresponds to the illustrative embodiment of FIG. 1B, prior to molding to form insulating body 102, sensors 106 and 108 may be mechanically coupled by coaxial annular insulating members 302 and 304 (e.g., O-rings, such as PTFE O-rings) to form an integrated module that facilitates maintaining a desired spacing between sensors 106 and 108 during the subsequent molding or casting process used to form insulating body 102 and embed sensors 106 and 108 therein. In some embodiments, pre-forming an integrated module of sensors 106 and 108 may include forming a insulating material in the space between sensors 106 and 108 (corresponding to the region having thickness d3 in FIG. 1C), which allows for further tailoring the inter-sensor capacitance value, and/or inter-sensor separation d3, through selection of an inter-sensor dielectric permittivity that may differ from (e.g., may be lower than) the dielectric permittivity of the material used to form insulating body 102.

With reference to FIGS. 1B and 1C, it can be seen that sensor electrode 106 is capacitively coupled directly (i.e., without an intervening electrode) to conductor 104 via intervening dielectric material of insulating body 102, sensor electrode 106 and conductor 104 thereby effectively being respective electrodes of a capacitor, referred to hereinbelow for ease of reference as LPVT sense capacitor, with the LPVT sense capacitance being proportional to length L2 indicated by arrow L2 (e.g., assuming an ideal cylindrical capacitor; neglecting fringing fields, stray or parasitic fields, etc.). Similarly, sensor electrode 108 is capacitively coupled directly to conductor 104 via the intervening dielectric material of insulating body 102 in the regions identified in FIG. 1B by arrows L1 and L3, sensor electrode 106 and conductor 104 thereby effectively being respective electrodes of a capacitor, referred to herein as VPIS/VDIS capacitor (i.e., VPIS or VDIS capacitor), with the VPIS/VDIS capacitance being proportional to the sum of lengths L1 and L3 indicated by respective arrows L1 and L3. In addition, sensor electrode 108 is capacitively coupled directly to sensor electrode 106 via the intervening dielectric material of insulating body 102, sensor electrodes 106 and 108 thereby effectively being respective electrodes of a capacitor, referred to herein as bridge capacitor, with the bridge capacitance being proportional to length L2. As well known to those skilled in the art, each of these cylindrical capacitances is inversely proportional to $\ln(1+d/a)$ (which approximates $d/a$ for $d \ll a$), where a is the radius of conductor 104, and d is the radial separation between the respective electrodes forming the capacitor; namely, d equals the distances d1, d2, and d3 for the LPVT-sense, VPIS/VDIS, and bridge capacitors, respectively, as depicted in FIG. 1C.

It is noted that sensor electrodes 106 and 108, though capacitively coupled to each other (bridge capacitance), are capacitively coupled separately to conductor 104. For clarity, as used herein, electrodes 106 and 108 being "capacitively coupled separately (or, similarly, being "separately capacitively coupled") to conductor 104 refers to sensor electrode 108 being capacitively coupled to conductor 104 via an intervening dielectric region that does not include the dielectric region via which sensor electrode 106 is capacitively coupled to conductor 104, and likewise, to sensor electrode 106 being capacitively coupled to conductor 104 via an intervening dielectric region that does not include the dielectric region via which sensor electrode 108 is capacitively coupled to conductor 106.

By way of non-limiting example for purposes of illustration only, in some embodiments employing ARALDITE® or similar synthetic resin for insulating body 102, the conductor 104 diameter may be about 20 mm within the sensor region, d1 may be at least 4 mm and preferably at least 8 mm, d3 may be at least about 4 mm and preferably not more than about 12 mm, and each electrode sensor 106 and 108 may have a nominal thickness of 1 mm, corresponding to d2 being at least about 8 mm and preferably not greater than about 22 mm.

Figure 5:
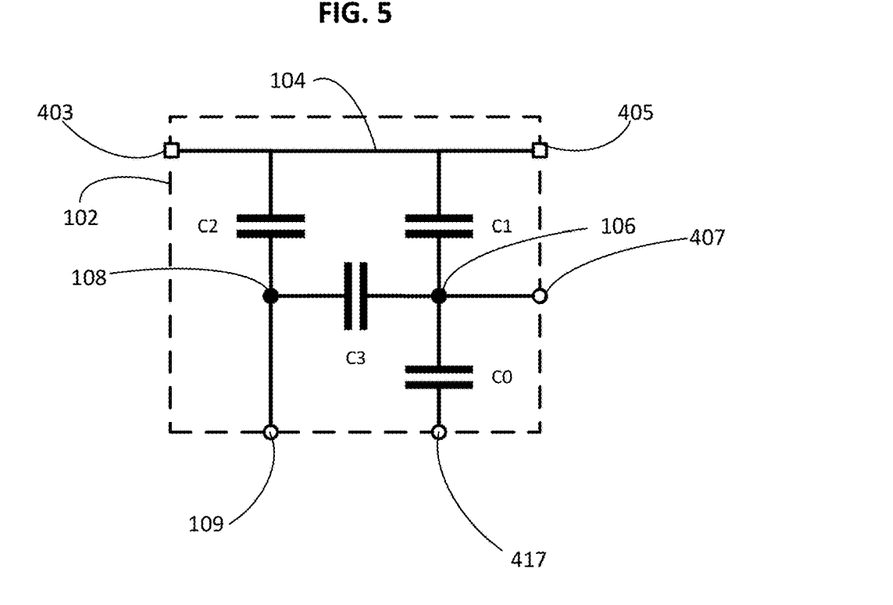
FIG. 5 schematically depicts an illustrative capacitive model of a capacitive voltage sensor as may be embodied in an illustrative bushing of FIGS. 1A-C, in accordance with some embodiments.

Referring now to FIG. 5, an illustrative capacitive model of a dual-voltage sensor according to the present disclosure is depicted, as may be embodied in an illustrative bushing 100 according to the embodiment described above with reference to FIGS. 1A-C. As such, various circuit elements and nodes in the circuit model of FIG. 5 are referenced by numerals of corresponding elements in FIGS. 1A-C. For instance, nodes 106 and 108 in FIG. 5 correspond to sensor electrodes 106 and 108, respectively; node 109 corresponds to connector 109; the region bounded by element 102 in FIG. 5 corresponds to the insulating body 102. Conductor 104 in FIG. 5 is depicted as having terminal 403 and 405, which may represent the end portions of conductor 104 with openings 103 and 105 in FIGS. 1A and 1B. Terminals 407 and 417 correspond to the inner and outer conductors, respectively, of connector 107 in FIGS. 1A and 1B.

Terminal 417 thus corresponds to the third terminal. It may be appreciated, therefore, that a function of the third terminal is to provide for coupling dual voltage capacitive sensor to a voltage (e.g., "ground") that provides a reference potential for, e.g., the first output signal (provided via the first output terminal) representing the voltage of the electrical conductor.

Further, it may be understood in view of the foregoing discussion that (i) capacitor C1 represents the LPVT sense capacitor corresponding to capacitive coupling between sensor electrodes 106 and conductor 104; (ii) capacitor C2 represents the VPIS/VDIS capacitor corresponding to capacitive coupling between sensor electrode 108 and conductor 104; (iii) capacitor C3 represents the bridge capacitor corresponding to capacitive coupling between sensor electrodes 106 and 108; and (iv) capacitor C0 is the low-voltage output capacitance of the capacitive voltage divider, e.g., corresponding to the parallel or series combination of capacitors 112 and 114 of FIG. 1A. By way of non-limiting example only for purposes of illustration, in some embodiments capacitances C0, C1, C2, and C3 may be designed to have a values in the following ranges: C1 may be about 10 to 20 pF, C2 may be about 10-50 pF, C3 may be about 65 to 75 pF, and C0 may be about 60 to 120 nF.

As may be appreciated, in some embodiments, such as where a dual voltage capacitive sensor in accordance with the present disclosure is implemented as a component that is not configured to conduct current therethrough (e.g., is implemented as an insulator rather than a bushing), one of terminals 403 and 405 may be eliminated from the model.

Figure 6:
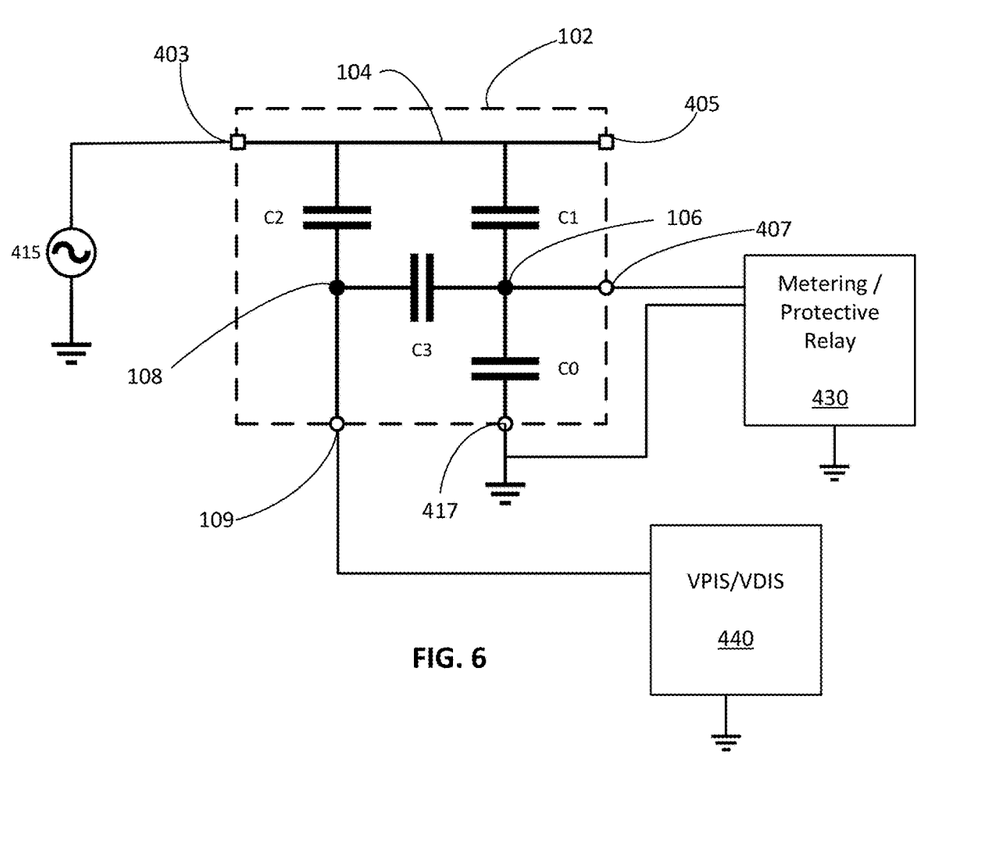
FIG. 6 schematically depicts a capacitive voltage sensor in accordance with the model of FIG. 5 configured for operation in an apparatus or system, in accordance with some embodiments.

FIG. 6 schematically depicts a dual voltage capacitive sensor in accordance with the model of FIG. 5 configured, in this illustrative embodiment, for operation to (i) couple an output signal from VPIS/VDIS capacitor C2 to VPIS or VDIS circuitry 440 representing the voltage on conductor 104, and (ii) to couple an output signal (representing the voltage on conductor 104) from the capacitive voltage divider formed by LPVT capacitor C1 and low-voltage output capacitor C0 to metering circuitry and/or a protective relay. As shown, conductor 104 is coupled to an AC voltage source 415 via terminal 403. By way of example, in some embodiments wherein the model represents a bushing in a switchgear comprising metering circuitry and/or protective relay 430 and VPIS or VDIS circuitry 440, AC voltage source 415 may represent an incoming feeder, and terminal 405 may be connected to other switchgear electrical components (not shown).

As represented by the model of FIG. 5 and in the illustrative implementation of FIG. 6, electrode 108 is not at ground or any other reference potential but floating and configured to provide an output capacitively coupled to conductor 104. That is, as described hereinabove, sensor electrode 108 is not coupled by a low impedance path to any conductor of the dual voltage capacitive sensor (e.g., bushing 100) that may be configured to be grounded or tied to a reference potential when the dual voltage capacitive sensor (e.g., embodied as bushing 100 or other component) is installed for intended operation. In addition, as discussed above, but not reflected in the circuit model, electrode 108 is also configured to shield electrode 106 from electric fields external to the capacitive sensor represented by the model.

It may be understood, therefore, that the dual voltage capacitive sensor represented by the model of FIG. 5 and as may be embodied in bushing 100 of FIGS. 1A-C (or in other implementations, such as insulators) is configured such that both sensor electrodes 106 and 108 are at respective floating potentials and are not conductively coupled to an electrode, terminal, or other conductor of bushing 100 that is configured to be conductively coupled (directly or indirectly) via a low impedance path to a ground potential or other reference potential (e.g., when the bushing is installed for operation, such as in switchgear, controlgear, or power transformer). For instance, connector 109 is configured to conductively couple the floating potential of sensor electrode 108 (e.g., via a shielded or unshielded single-conductor wire plugged or screwed into connector 109) to external circuitry (i.e., external to bushing 100), such as that of a voltage presence indicator system (VPIS). In other words, connector 109 is configured to capacitively couple the voltage on conductor 104 to external circuitry via the VPIS capacitor formed by conductor 104 and sensor electrode 108.

Similarly, connector 107 is configured to conductively couple the floating potential of sensor electrode 106 to external circuitry, such as protection and/or metering circuitry. In accordance with the present illustrative embodiment, connector 107 may be configured as an electronic connector (e.g., a mini-BNC female connector) having, as described above, an outer shield conductor conductively coupled to a second common terminal of the parallel-connected capacitors 112 and 114, which have a first common terminal conductively coupled to both the inner conductor of connector 107 and the sensor electrode 106.

Figure 7A:
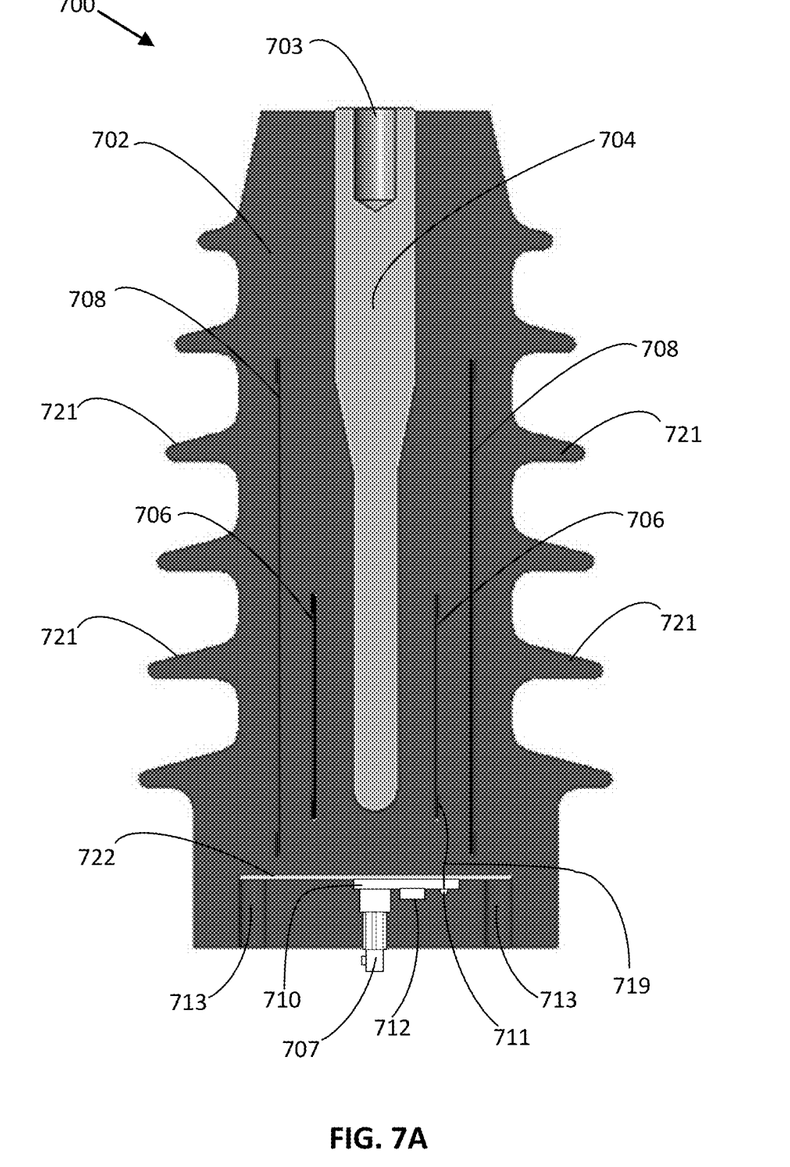
FIGS. 7A and 7B are illustrative schematic orthogonal cross-sectional views of an illustrative capacitive voltage sensor, in accordance with some embodiments.
Figure 7B:
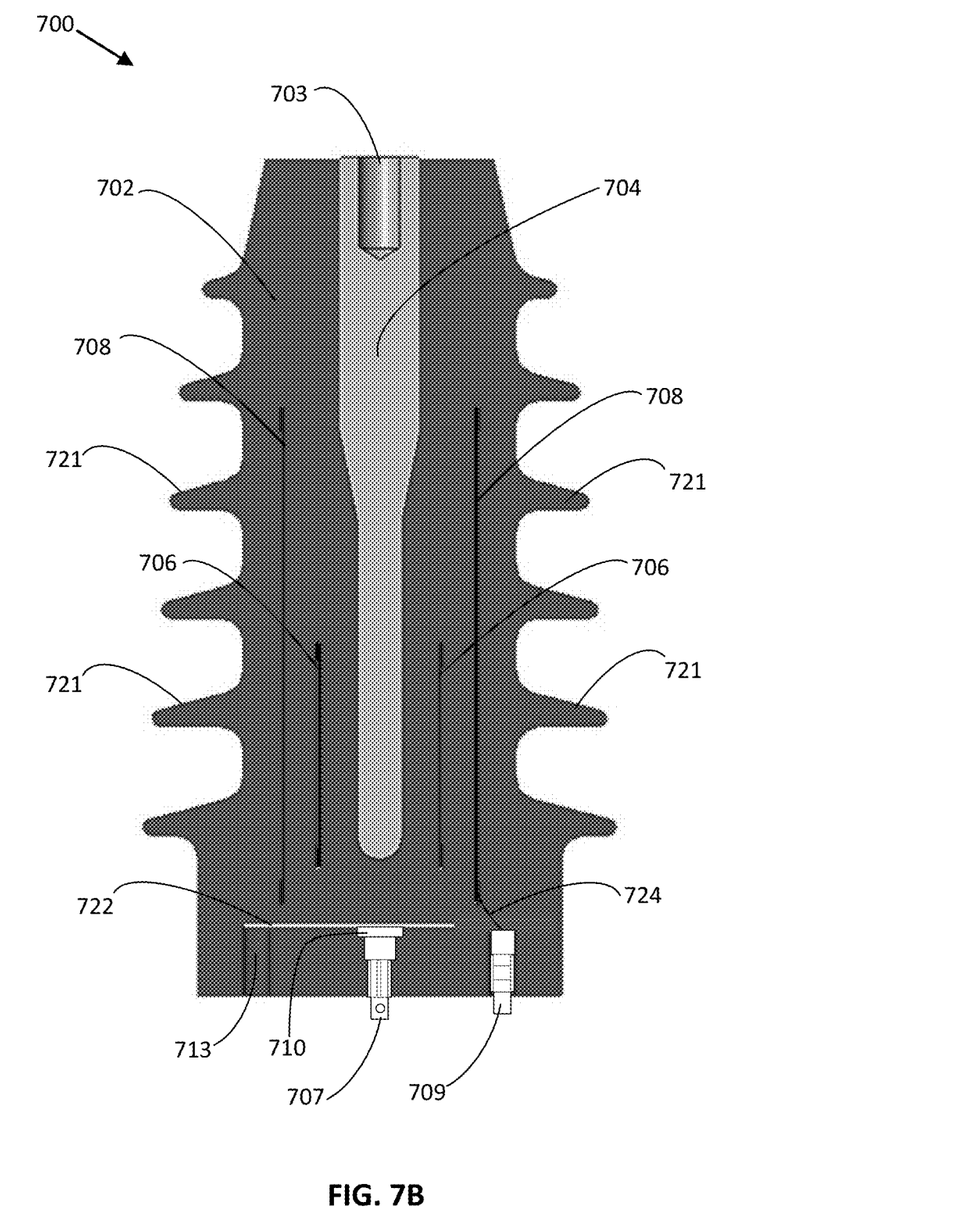

As noted above, embodiments of a capacitive voltage sensor according to the present disclosure are not limited to bushings, such as the illustrative bushing embodiments discussed above. By way of example, FIGS. 7A and 7B depict an illustrative embodiment of a capacitive voltage sensor 700 that may be implemented as a dedicated sensor (e.g., LPVT and VPIS/VDIS), or as a post insulator or busbar support, such as may be used in MV switchgear, controlgear, or power transformer. Capacitive voltage sensor 700 is generally cylindrically shaped, and FIGS. 7A and 7B are cross-sectional views of orthogonal planes containing the central longitudinal axis.

As shown, capacitive voltage sensor 700 comprises an insulating body 702 that includes sheds 721; an elongated conductor 704 that extends axially along the center of the insulating body 702 and includes opening 703 for connection to an external conductor (e.g., busbar); a cylindrical-shell-shaped sensor electrode 706 spaced away from and generally coaxial with conductor 704; a cylindrical-shell-shaped sensor electrode 708 spaced away from and surrounding and generally coaxial with sensor electrode 706; a printed circuit board (PCB) 710 mounted on a conductive base 722; a solder joint 711 formed on PCB 710 to electrically connect thereto one end of a conductor 719 (e.g., an insulated wire) that passes through an aperture or opening in conductive base 722 and an aperture or opening through PCB 710, and has an opposite end electrically connected (e.g., soldered) to sensor electrode 706; capacitors 712 (e.g., a film chip capacitor) mounted on PCB 710 and having a terminal thereof conductively coupled to solder joint 711 (and thus to sensor 706); a connector 707 mounted on PCB 710 and having a portion exposed to the exterior of insulating body 702, and having an inner conductor conductively coupled to solder joint 711 (and thus to sensor electrode 106 and to the first terminal of capacitors 712), and having an outer shield conductor conductively coupled to a second terminal of capacitor 712; and a connector 709 electrically connected via conductor 724 (e.g., insulated wire) to sensor electrode 708 and having a portion exposed to the exterior of insulating body 702. Openings 713 in insulating body 702 are configured for connecting conductive base 722 to a reference potential (e.g., to ground) while also, in some embodiments, providing for mechanically securing the base of the capacitive voltage sensor.

In view of the present disclosure, it will be understood that components of capacitive voltage sensor 700 generally corresponding to those of capacitive voltage sensor 100 in the illustrative embodiment of FIGS. 1A-C may have similar features and modifications thereof. In addition, in view of the present disclosure, those skilled in the art will further understand that various alternative embodiments of capacitive voltage sensor 700 may be implemented. For instance, alternatively, PCB 710 (and capacitor 712 mounted thereon) may be mounted onto sensor electrode 708, with conductors (e.g., wires) being added to electrically connect the PCB to connector 707. Additionally or alternatively, connector 707 may be located closer to the periphery (e.g., similar to the location of connector 707) rather than along the central axis.

Figure 8A:
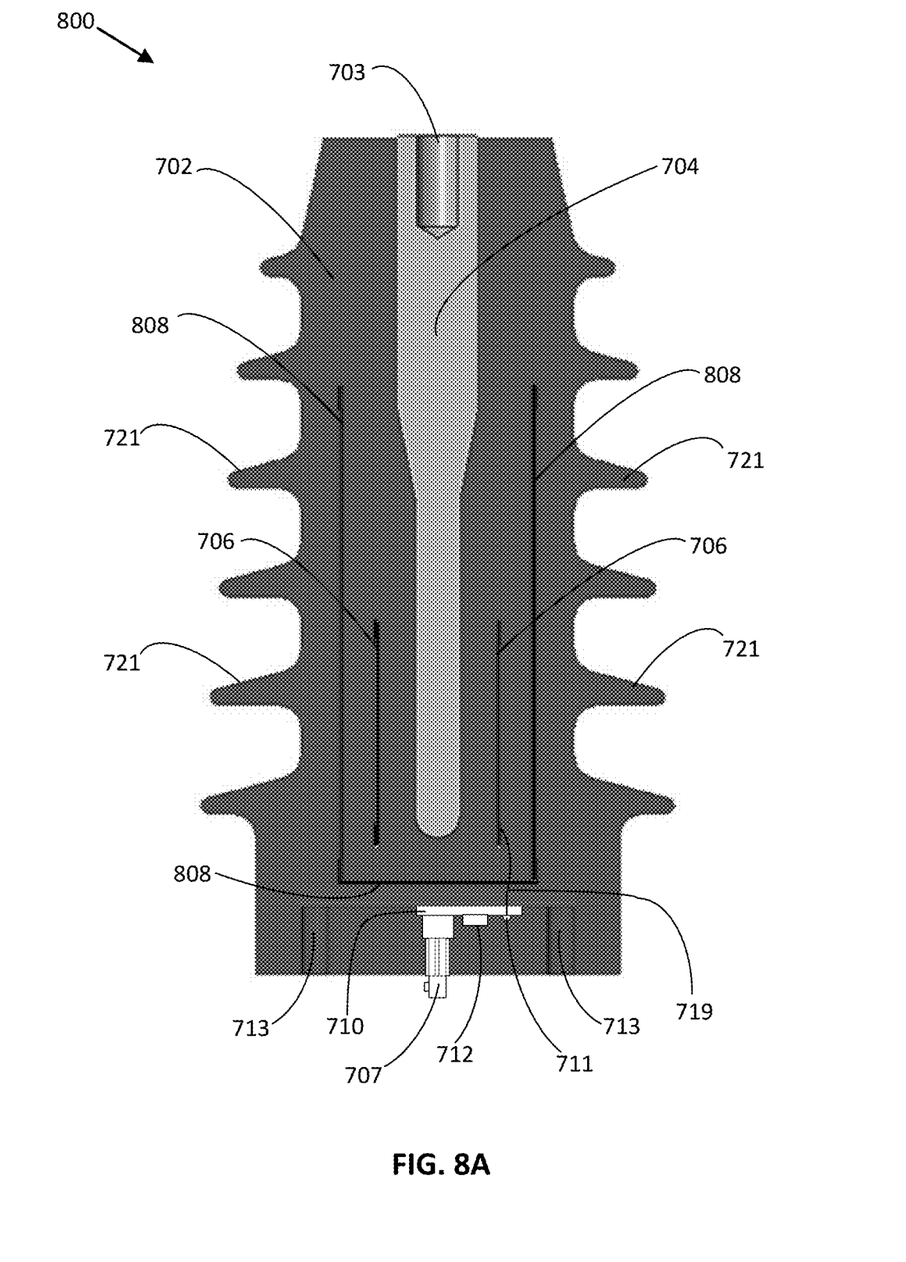
FIGS. 8A and 8B are illustrative schematic orthogonal cross-sectional views of an illustrative alternative embodiment of a capacitive voltage sensor, in accordance with some embodiments.
Figure 8B:
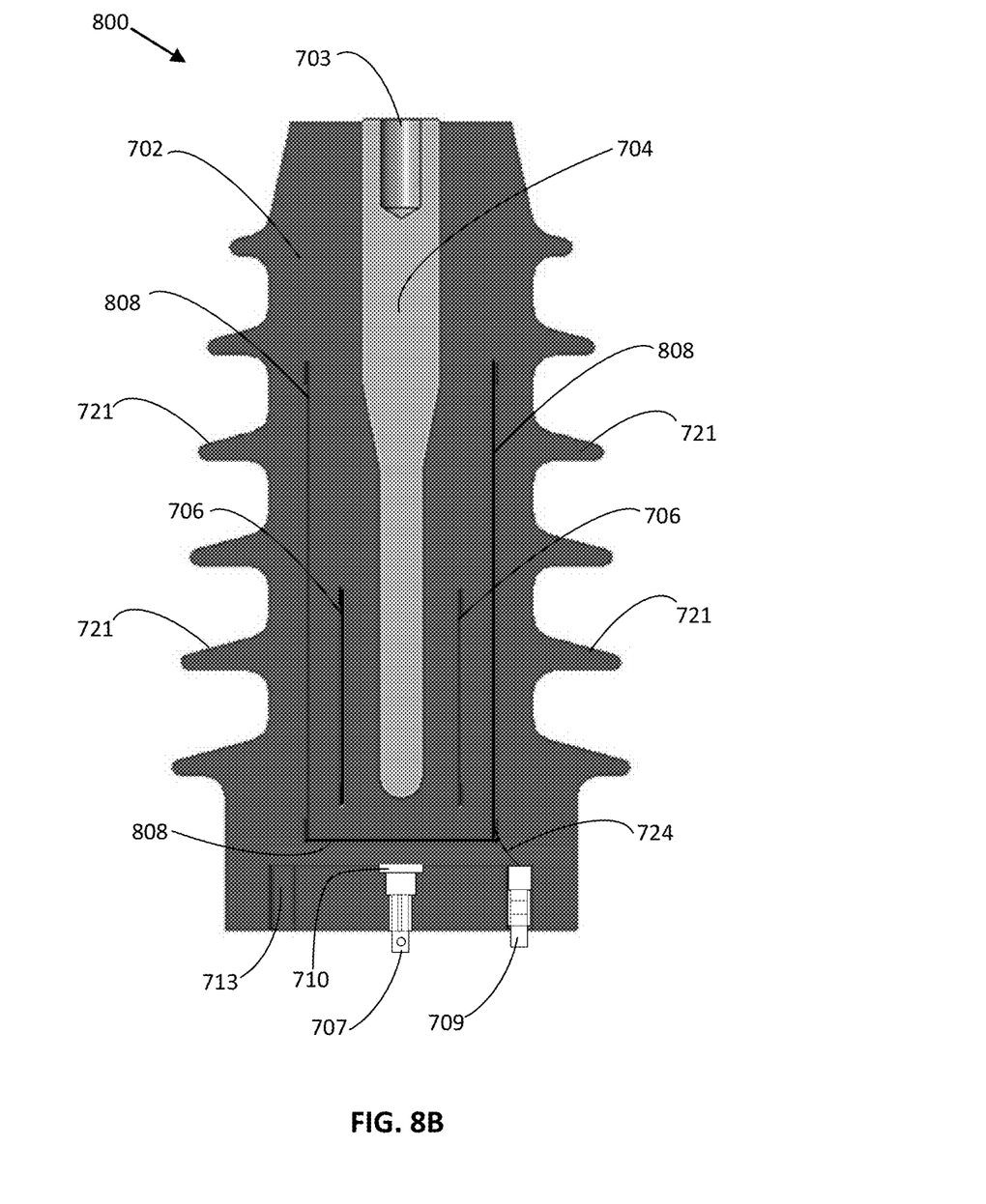

FIGS. 8A and 8B illustrate cross-sectional views of an illustrative alternative embodiment of a capacitive voltage sensor 800, generally corresponding to capacitive voltage sensor 700, except eliminating conductive base 722 and modifying the outer (e.g., VPIS/VDIS) sensor electrode to have a closed conductive surface disposed at its lower longitudinal end. More specifically, sensor electrode 808 is generally a cylindrically-shaped shell, with the lower longitudinal end closed (e.g., using the same conductive material structure as the cylindrical sidewall portions, which may be a conductive mesh). In other words, sensor electrode 808 is generally cup-shaped. The closed lower portion of electrode 808 provides sufficient shielding of sensor electrode 706 and conductor (electrode) 704 from external electric fields, such as those that may be generated from the medium-voltage conductor to which the capacitive voltage sensor is electrically connected. Accordingly, conductive base 722 may be eliminated, as its function is subsumed into sensor electrode 808. In this regard, it is noted that to ensure adequate electric-field shielding by conductive base 722, it generally must be disposed very close (e.g., less than about 4 mm) to the lower extent of the VPIS/VDIS sensor electrode 708. According, it elimination in capacitive voltage sensor 800 not only reduces manufacturing costs, but also simplifies manufacturing, improves manufacturing yield, and also may improve lifetime and reliability.

As may be appreciated in view of the foregoing, capacitive voltage sensors 700 and 800, like capacitive voltage sensor 100, may provide both VPIS and precision LPVT output signals (i.e., at connectors 709 and 707, respectively), without necessarily requiring embedding a dedicated electric field shield (e.g., a grounded screen) surrounding the LPVT sensor. Further, capacitive voltage sensor 800 eliminates the need for any additional electric field screen (e.g., conductive base 722).

Although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, the structure and/or function of a component may be combined into a single component or divided among two or more components. In addition, it is specifically contemplated that a particular feature described, either individually or as part of an embodiment, can be combined with other individually described features, or parts of other embodiments. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with claims that are based on the present disclosure, as such claims may be presented herein and/or in any patent applications claiming priority to, based on, and/or corresponding to the present disclosure.

What is claimed is:

1. A capacitive voltage sensor apparatus comprising:
an electrically insulating body having an outer surface;
an electrical conductor at least partially embedded in the insulating body;
a first terminal configured to electrically connect the electrical conductor to an external conductor to be sensed;
a first electrically conductive sensor electrode disposed in the electrically insulating body between the electrical conductor and the outer surface of the electrically insulating body, wherein the first electrically conductive sensor electrode is electrically floated and capacitively coupled to the elongated electrical conductor;
a second electrically conductive sensor electrode disposed in the electrically insulating body between the first electrically conductive sensor electrode and the outer surface of the electrically insulating body such that the first electrically conductive sensor electrode is disposed between the electrical conductor and the second electrically conductive sensor electrode, wherein the second electrically conductive sensor electrode is electrically floated and capacitively coupled separately to the electrical conductor and the first electrically conductive sensor electrode;
a first output terminal on the electrically insulating body and electrically coupled to the first electrically conductive sensor electrode to provide a first output signal representing the voltage of the electrical conductor; and
a second output terminal on the electrically insulating body and electrically coupled to the second electrically conductive sensor electrode to provide a second output signal representing the voltage of the electrical conductor; and
a third terminal on the electrically insulating body configured to be electrically connected to a reference potential.

2. The capacitive voltage sensor according to claim 1, further comprising a capacitor disposed within said electrically insulating body and configured to electrically couple said first electrically conductive sensor electrode to said third terminal, thereby forming a capacitive voltage divider.

3. The capacitive voltage sensor according to claim 2, wherein the capacitor is disposed on or in a printed circuit board that is mounted on said second electrically conductive sensor.

4. The capacitive voltage according to claim 3, wherein the second output terminal and the third terminal are configured as an inner conductor and an outer shield conductor, respectively, of an electrical connector that is coupled to said printed circuit board.

5. The capacitive voltage sensor according to claim 1, wherein the electrical conductor is elongated and extends lengthwise within the insulating body, and wherein said first terminal is integral to a first longitudinal end of the electrical conductor that is exposed through the insulating body.

6. The capacitive voltage sensor according to claim 5, wherein the second electrically conductive electrode is configured as a cylindrical shell disposed coaxially with the elongated electrical conductor and extending longitudinally over a second length, thereby defining an interior volume between the electrical conductor and the second electrically conductive electrode, wherein the first sensor electrode is disposed completely within said interior volume and has a longitudinal extent that is less than the second length.

7. The capacitive voltage sensor according to claim 6, wherein the first electrically conductive electrode is configured as a cylindrical shell disposed coaxially with and radially surrounded by the first electrically conductive electrode.

8. The capacitive voltage sensor according to claim 7, wherein a respective cylindrical segment of each longitudinal end of the second electrically conductive electrode is separated from the electrical conductor by a respective portion of the insulating body that does not include a portion of the first electrically conductive electrode, wherein the respective cylindrical segments are separated by an intervening segment of the second electrically conductive electrode having the second length and radially surrounding the first electrically conductive electrode.

9. The capacitive voltage sensor according to claim 5, wherein the capacitive voltage sensor apparatus is configured as a bushing, wherein said first terminal is integral to a first longitudinal end of the electrical conductor that is exposed through the insulating body, and wherein a second longitudinal end of the electrical conductor opposite to the first longitudinal end is exposed through the insulating body and includes a second terminal configured to electrically connect the electrical conductor to a second external conductor to provide for current conduction between the first and second external conductor via the electrical conductor.

10. The capacitive voltage sensor according to claim 5, wherein the first terminal is configured to be coupled to a busbar, and the capacitive voltage sensor is configured as a low-power voltage transformer, a post insulator, or a bus support.

11. The capacitive voltage sensor according to claim 1, wherein the second sensor electrode has a capacitance configured for coupling to a voltage presence indicating system or a voltage detection indicating system.

12. The capacitive voltage sensor according to claim 1, wherein the insulating body comprises epoxy resin.

13. The capacitive voltage sensor according to claim 1, further comprising a temperature sensor embedded in the electrically insulating body, and a second connector disposed on the electrically insulating body and electrically connected to the temperature sensor.

14. The capacitive voltage sensor according to claim 13, wherein the temperature sensor is mounted on a second printed circuit board.

* * * * *